(12) United States Patent
Nakamura et al.

(10) Patent No.: US 10,285,274 B2
(45) Date of Patent: May 7, 2019

(54) CIRCUIT STRUCTURE

(71) Applicants: AutoNetworks Technologies, Ltd., Yokkaichi, Mie (JP); Sumitomo Wiring Systems, Ltd., Yokkaichi-shi, Mie (JP); SUMITOMO ELECTRIC INDUSTRIES, LTD., Osaka-shi, Osaka (JP)

(72) Inventors: Arinobu Nakamura, Mie (JP); Tou Chin, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/545,120

(22) PCT Filed: Jan. 13, 2016

(86) PCT No.: PCT/JP2016/050749
§ 371 (c)(1),
(2) Date: Jul. 20, 2017

(87) PCT Pub. No.: WO2016/125543
PCT Pub. Date: Aug. 11, 2016

(65) Prior Publication Data
US 2017/0367189 A1 Dec. 21, 2017

(30) Foreign Application Priority Data
Feb. 3, 2015 (JP) ................................ 2015-019385

(51) Int. Cl.
*H05K 1/05* (2006.01)
*H05K 1/18* (2006.01)
*H05K 1/02* (2006.01)

(52) U.S. Cl.
CPC ........... *H05K 1/183* (2013.01); *H05K 1/0263* (2013.01); *H05K 1/05* (2013.01);
(Continued)

(58) Field of Classification Search
USPC ........................................ 361/761, 760, 748
See application file for complete search history.

(56) References Cited

U.S. PATENT DOCUMENTS

| 7,352,601 B1* | 4/2008 | Minneman | H05K 1/0284 |
| | | | 365/185.05 |
| 2008/0080151 A1* | 4/2008 | Shimizu | H05K 1/0263 |
| | | | 361/760 |

FOREIGN PATENT DOCUMENTS

| JP | 2003164040 A | 6/2003 |
| JP | 2005-224053 A | 8/2005 |

(Continued)

OTHER PUBLICATIONS

Search Report for Int'l. Appln. No. PCT/J02016/058646, dated May 24, 2016.

*Primary Examiner* — Andargie M Aychillhum
(74) *Attorney, Agent, or Firm* — Honigman LLP

(57) ABSTRACT

A circuit structure is provided to which an electronic component can be easily mounted (electrical connection of terminals). A circuit structure that includes a substrate provided with a conductive pattern on one face thereof; a conductive member fixed to the other face of the substrate; an electronic component that has first terminals and of a plurality of terminals, that are electrically connected to the conductive member, and a second terminal of the plurality of terminals that is electrically connected to the conductive pattern provided on the substrate; and a relay member for electrically connecting the second terminal and the conductive pattern provided on the substrate, at least a portion of the (Continued)

relay member being fixed to the conductive member via an insulating material.

10 Claims, 6 Drawing Sheets

(52) U.S. Cl.
CPC ............... *H05K 2201/0311* (2013.01); *H05K 2201/09072* (2013.01); *H05K 2201/10166* (2013.01); *H05K 2201/10272* (2013.01); *H05K 2201/10363* (2013.01)

(56) References Cited

FOREIGN PATENT DOCUMENTS

| | | |
|---|---|---|
| JP | 2006-005096 A | 1/2006 |
| JP | 2006-100553 A | 4/2006 |

\* cited by examiner

CIRCUIT STRUCTURE

CROSS-REFERENCE TO RELATED APPLICATIONS

This application is the U.S. national stage of PCT/JP2016/050749 filed Jan. 13, 2016, which claims priority of Japanese Patent Application No. JP 2015-019385 filed Feb. 3, 2015.

TECHNICAL FIELD

The present invention relates to a circuit structure that includes a substrate and a conductive member.

BACKGROUND

Circuit structures are known in which a conductive member that constitutes a circuit for conducting a comparatively large current is fixed to a substrate provided with a conductive pattern that constitutes a circuit for conducting a comparatively small current (for example, see JP 2003-164040A below).

In the circuit structure disclosed in JP 2003-164040A, a main portion of an electronic component (FET) is mounted on the conductive member, and at least one of the terminals of the main portion is connected to the conductive member while the other terminal or terminals are connected to the substrate (see FIG. 4 of JP 2003-164040A). Because there is a height difference (step difference), which corresponds to the thickness of the substrate, between a surface of the substrate and a surface of the conductive member, there is a need to perform processing such as bending of either of the terminals. There may be cases where bending cannot be performed if the terminals are short.

The issue to be solved by the present invention is to provide a circuit structure to which an electronic component can be easily mounted (electrical connection of terminals).

SUMMARY

A circuit structure according to the present invention for solving the above problem includes a substrate provided with a conductive pattern on one face thereof, a conductive member fixed to the other face of the substrate; an electronic component that has a first terminal of a plurality of terminals that is electrically connected to the conductive member, and a second terminal of the plurality of terminals that is electrically connected to the conductive pattern provided on the substrate; and a relay member for electrically connecting the second terminal and the conductive pattern provided on the substrate, at least a portion of the relay member being fixed to a face on the substrate side of the conductive member via an insulating material.

It is preferable that one side of the relay member is connected to the second terminal of the electronic component, and the circuit structure further includes a step difference absorbing member that joins the other side of the relay member and the conductive pattern provided on the one face of the substrate, which is located at a position higher than the relay member.

It is preferable that one side of the relay member is connected to the second terminal of the electronic component, and the other side is connected to the conductive pattern provided on the one face of the substrate, and a portion of the one side of the relay member is fixed to the conductive member.

It is preferable that a portion of the substrate is located between one side of the relay member to which a certain portion is connected and the other side of the relay member to which another portion is connected.

It is preferable that an opening is formed in the substrate, and the electronic component is mounted on the conductive member via the opening.

Advantageous Effects of Invention

The circuit structure according to the present invention is one in which the second terminal and the conductive pattern provided on the substrate are electrically connected to each other by the relay member fixed to a face, on the substrate side, of the conductive member via an insulating material. Accordingly, the second terminal and the conductive pattern provided on the substrate can be electrically connected to each other (connection work can be performed) with ease. There is no need to perform processing such as bending of the terminals as was conventionally performed, and connection work can be performed with ease even if the terminals are short.

Electrically connecting the second terminal and the conductive pattern provided on the substrate (connection work) to each other is made even easier by using a step difference absorbing member that joins the other side of the relay member and the conductive pattern provided on the one face of the substrate, which is located at a position higher than the relay member.

The second terminal and the conductive pattern can be directly joined to each other by using the relay member, a portion of the one side of the relay member being fixed to the conductive member (the other portion not being fixed).

If a portion of the substrate is located between one side of the relay member to which a certain portion is connected and the other side of the relay member to which another portion is connected, the connection material, such as solder, used at one connection portion is suppressed from flowing to the other connection portion by this portion of the substrate.

Assuming a structure where the electronic component is mounted on the conductive member, the first terminals and the conductive member can be connected (connection work can be performed) with ease.

DETAILED DESCRIPTION OF PREFERRED EMBODIMENTS

Embodiments of the present invention will be described below in detail with reference to the drawings. Note that, unless indicated otherwise, "surface direction" in the following description refers to the surface direction of a substrate 10 and a conductive member 20, and "height direction" (up-down direction) refers to a direction that is orthogonal to the surface direction (taking the side of the substrate 10 from which an electronic component 30 is mounted as the upper side). Note that these directions do not limit the orientation in which a circuit structure 1 can be installed.

Figure 1:
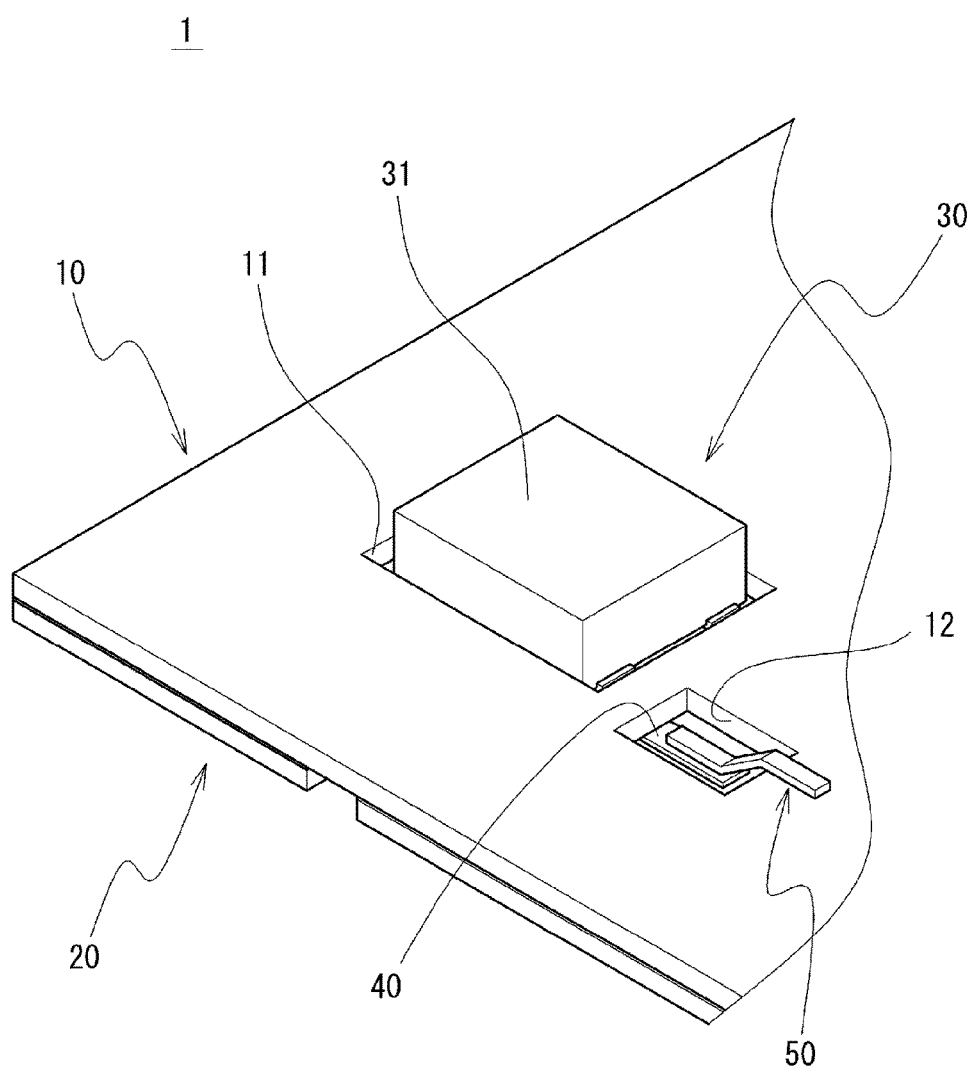
FIG. 1 is an external view of a circuit structure according to an embodiment of the present invention, and is an enlargement of a portion where an electronic component (transistor) is mounted.
Figure 2:
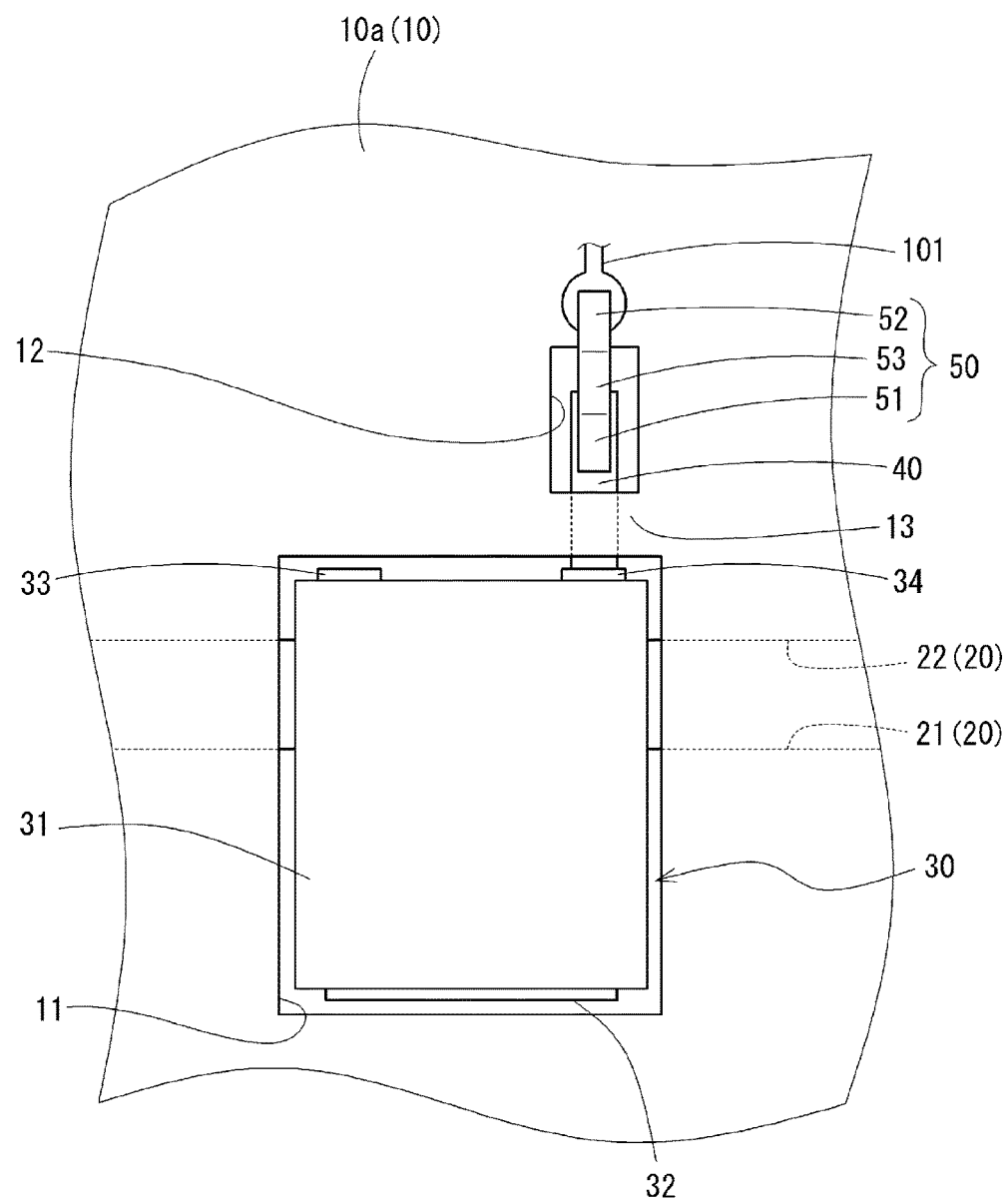
FIG. 2 is a plan view of the portion of the circuit structure shown in FIG. 1, where the electronic component is mounted (seen from substrate side).
Figure 3:
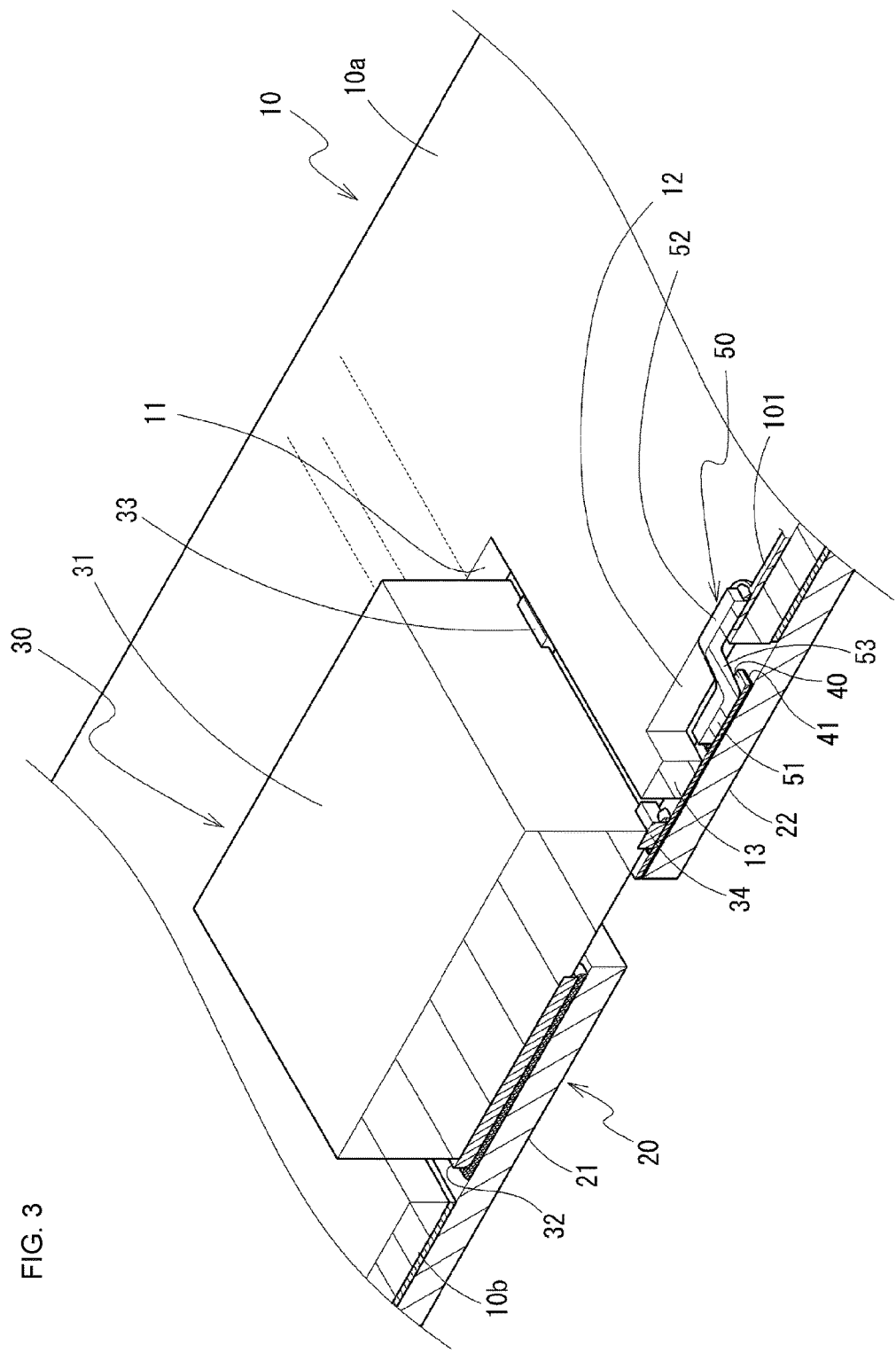
FIG. 3 is a perspective view (partial cross-sectional view) illustrating a connection structure of the circuit structure shown in FIG. 1, including a relay member.
Figure 4:
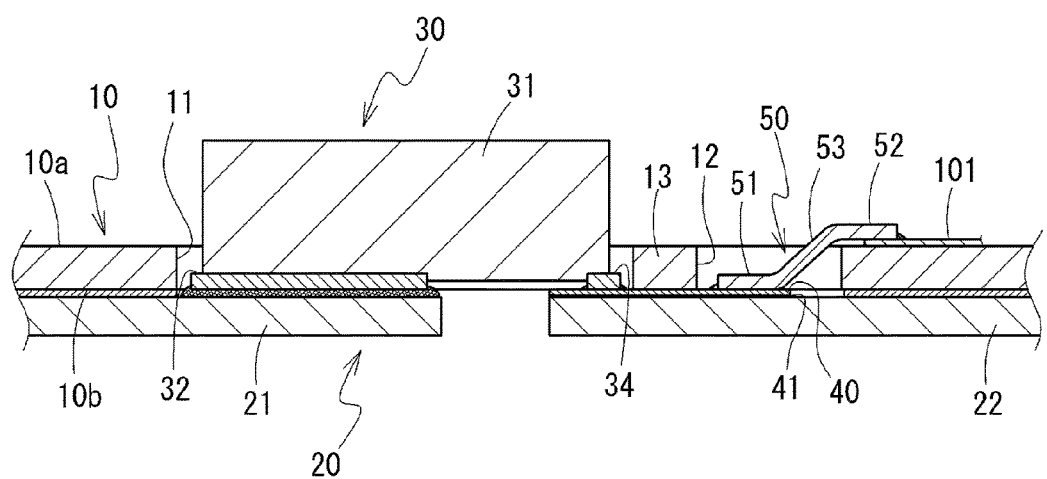
FIG. 4 is a cross-sectional view (taken along a plane passing through a second terminal and the relay member) of the portion of the circuit structure shown in FIG. 1, where the electronic component is mounted.

The circuit structure 1 according to the embodiment of the present invention shown in FIG. 1 to FIG. 4 includes the substrate 10, the conductive member 20, the electronic component 30, and a relay member 40. The substrate 10 is a substrate provided with a conductive pattern 101 on one face 10a (upper face) thereof (to facilitate comprehension of the drawings, only a portion thereof is shown in FIGS. 2 to 4, and is omitted from FIG. 1). The conductive path constituted by the conductive pattern 101 is part of a control circuit, and the current that flows therethrough is relatively small compared to that which flows through the conductive path formed by the conductive member 20.

The conductive member 20 is a plate-shaped portion fixed to the other face 10b (lower face) of the substrate 10. The conductive member 20 is formed into a predetermined shape through processing such as stamping, and constitutes a conductive path for power, the conductive path being a portion through which a relatively large (larger than the current flowing through the conductive path formed by the conductive pattern 101) current flows. Note that a description and drawings of a specific configuration of the conductive paths have been omitted. The conductive member 20 is also referred to as a bus bar (bus bar plate), for example. The conductive member 20 is fixed to the other face 10b of the substrate 10 via an insulating adhesive agent or an adhesive sheet, for example. Thus, the substrate 10 and the conductive member 20 are one unit. Note that a heat dissipating member (e.g. a plate provided with fins) may be fixed to the bottom side (side opposite to substrate 10 side) of the conductive member 20. If the heat dissipating member is made of a conductive material, the conductive member 20 and the heat dissipating member are insulated from each other. A configuration may also be employed where no heat dissipating member is provided, and at least a portion of the conductive member 20 is exposed to the outside and the conductive member 20 itself has the function of dissipating heat.

The electronic component 30 is an element mounted in the substrate 10 and has a main portion 31 and terminals. The terminals of the electronic component 30 according to the present embodiment can be classified into those that are to be electrically connected to the conductive member 20 and those that are to be electrically connected to the conductive pattern 101 provided on the substrate 10. Below, terminals that are to be electrically connected to the conductive member 20 may be referred to as "first terminals", and a terminal to be electrically connected to the conductive pattern 101 provided on the substrate 10 may be referred to as a "second terminal". Examples of the electronic component 30 include a transistor (FET). In this case, a drain terminal 32 and a source terminal 33 correspond to the first terminals, and a gate terminal 34 corresponds to the second terminal. Note that, below, the circuit structure 1 is described using a transistor (FET) as an example of the electronic component 30, but to facilitate comprehension of the description, it is assumed that the transistor has one drain terminal 32, one source terminal 33, and one gate terminal 34. However, there does not necessarily have to be only one of each terminal. Also, an element other than a transistor may be mounted in the substrate 10.

The drain terminal 32, which is a first terminal, is located on one side of the main portion 31. The source terminal 33, which is a first terminal, is located on the other side (side opposite to the side on which the drain terminal 32 is located) of the main portion 31. The gate terminal 34, which is the second terminal, is located on the same side as the source terminal 33. The terminals are located on the lower side of the main portion 31. Specifically, the bottom face of the main portion 31 is a face where portions of the terminals are exposed.

In order to prevent the drain terminal 32 and the source terminal 33 from short circuiting, the conductive member 20 is divided into a portion (hereinafter also referred to as "first portion 21") to which the drain terminal 32 is connected, and a portion (hereinafter also referred to as "second portion 22") to which the source terminal 33 is connected. A first opening 11 through which the electronic component 30 can pass is formed in the substrate 10. The electronic component 30 (main portion 31) according to the present embodiment is mounted on the conductive member 20 via the first opening 11. The drain terminal 32 is located on one side of the main portion 31 and the source terminal 33 is located on the other side of the main portion 31, and therefore the electronic component 30 (main portion 31) is mounted on the conductive member 20 straddling the first portion 21 and the second portion 22 of the conductive member 20 (such that the space between the first portion 21 and the second portion 22 is located between the drain terminal 32 and the source terminal 33). Then, using a solder or the like, the drain terminal 32 is connected to the fist portion 21 and the source terminal 33 is connected to the second portion 22. The connection structure between the conductive member 20 and the drain terminal 32 or the source terminal 33 may take any form, and thus a description thereof has been omitted.

The gate terminal 34 is located on the same side as the source terminal 33 (other side of the main portion 31). In the present embodiment, the relay member 40 is provided on the second portion 22 of the conductive member 20, on the side in which the gate terminal 34 is located. The relay member 40 is a foil-shaped member (e.g. a copper foil) made of a conductive material, and an insulating material 41 is interposed between the relay member 40 and the conductive member 20 (the second portion 22). In other words, the relay member 40 and the conductive member 20 (the second portion 22) are insulated from each other. The relay member 40 and the conductive member 20 may be made into one unit by fixing the lower face of the copper foil covered by the insulating material 41 to the conductive member 20. In the present embodiment, the entire relay member 40 is joined to the conductive member 20 (second portion 22) via the insulating material 41. Note that the relay member 40 in the present embodiment may also be formed by a hard member that does not easily deform (in the case of a later-described variation, the relay member 40 needs to be formed by a member that is deformable).

The conductive material is exposed on the upper face (face on the side opposite to the conductive member 20) of the relay member 40. The gate terminal 34 is connected to the upper face of the relay member 40, at the one side thereof, by a solder or the like. In the present embodiment, a step difference absorbing member 50 made of a conductive material is connected to the upper face of the relay member 40, on the other side thereof, by a solder or the like. In other words, the gate terminal 34 is electrically connected to the step difference absorbing member 50 via the relay member 40.

In the present embodiment, a partition portion 13, which is a portion of the substrate 10, is located between the one side of the relay member 40 to which the gate terminal 34 is connected and the other side of the relay member 40 to which the step difference absorbing member 50 is connected. In other words, focusing on the relay member 40, the partition portion 13 is provided located between the connection portion where the relay member 40 is connected to one member and a connection portion where the relay member 40 is connected to another member. If the partition portion 13 is located between both connection portions in this manner, the connection material (e.g. solder) used at one connection portion can be prevented from flowing to the other connection portion (the amount of connecting material at each connection portion can be kept at a suitable amount). Also, the partition portion 13 can prevent the relay member 40 from curling up.

The step absorbing portion 50 has a shape in which a lower portion 51 and an upper portion 52, which extend in the surface direction, are joined by an intermediate portion 53. The difference in height between the lower portion 51 and the upper portion 52 is set to be substantially the same as the thickness of the substrate 10. The lower portion 51 of the step difference absorbing member 50 is connected to the upper face of the above-described relay member 40, at the other side thereof. On the other hand, the upper portion 52 of the step difference absorbing member 50 is connected to the conductive pattern 101 (land) provided on the one face 10a of the substrate 10, by a solder or the like. In other words, the gate terminal 34 is electrically connected to the conductive pattern 101 provided on the substrate 10 via the relay member 40 and the step difference absorbing member 50.

The lower portion 51 of the step difference absorbing member 50 enters a second opening 12 formed in the substrate 10. In other words, the one side of the relay member 40 to which the gate terminal 34 is connected is not covered by the substrate 10 and is exposed via the first opening 11, and the other side to which the step difference absorbing member 50 is connected is not covered by the substrate 10 and is exposed via the second opening 12. The portion of the substrate 10 that is located between the first opening 11 and the second opening 12 is the above-described partition portion 13.

In the circuit structure 1 according to the present embodiment comprising such a configuration, the gate terminal 34 (second terminal) and the conductive pattern 101 provided on the substrate 10 are electrically connected to each other as a result of the relay member 40 being fixed to the face of the conductive member 20, the face being on the substrate 10 side, via the insulating material 41. Accordingly, the gate terminal 34 and the conductive pattern 101 provided on the substrate 10 can be electrically connected to each other (connection work can be performed) with ease. There is no need to perform processing such as bending on the terminals as was conventionally performed, and connection work can be performed with ease even if the terminals are short.

Also, as is the case with the present embodiment, electrically connecting the gate terminal 34 (second terminal) and the conductive pattern 101 provided on the substrate 10 with each other (connection work) can be made even easier by using the step difference absorbing member 50 that joins the other side of the relay member 40 and the conductive pattern 101 provided on the one face 10a of the substrate 10, which is located at a position higher than the relay member 40. The step difference absorbing member 50 can be connected to the relay member 40 and the conductive pattern 101 of the substrate 10 in the same step (e.g. reflow soldering step) as the step of mounting the electronic component 30 (connecting the terminals to the conductive member 20 and the relay member 40). At this time, flowing of the connection material, such as solder, from one of the connection portion connecting the gate terminal 34 (second terminal) and the relay terminal 40 to the other connection portion connecting the relay member 40 and the step difference absorbing member 50 can be prevented by the partition portion 13 provided in the substrate 10. Note that, if such a partition portion 13 is not provided, a configuration may also be employed in which an opening combining the first opening 11 and the second opening 12 is formed in the substrate 10.

Figure 5:
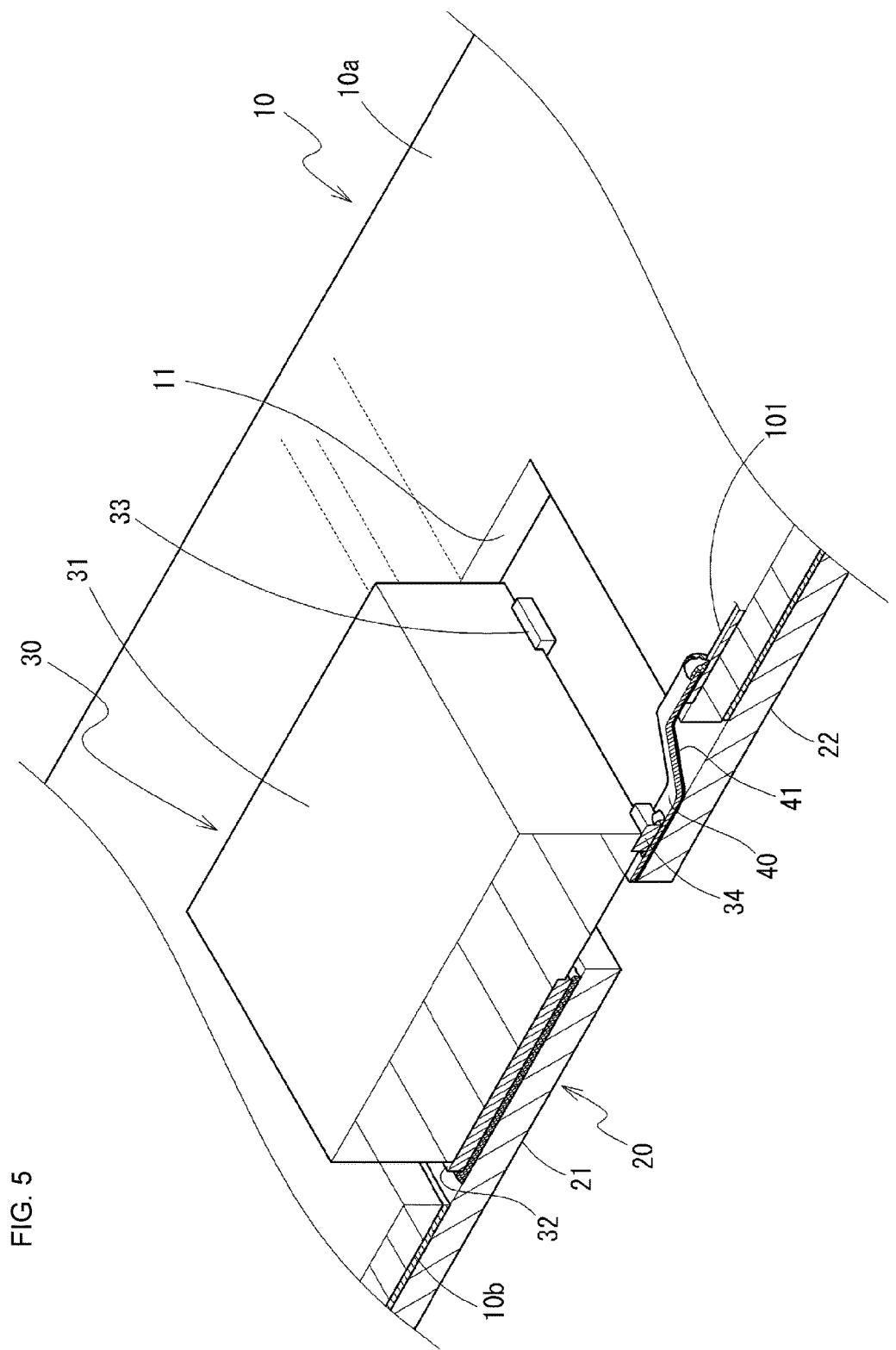
FIG. 5 is a perspective view (partial cross-sectional view) illustrating a connection structure of a circuit structure according to a variation, including a relay member.
Figure 6:
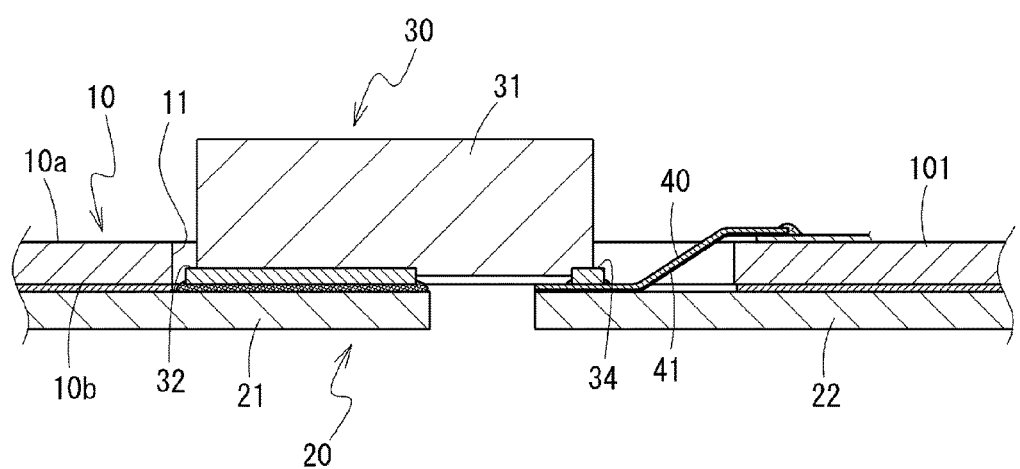
FIG. 6 is a cross-sectional view (taken along a plane through a second terminal and the relay member) of the portion of the circuit structure shown in FIG. 5 where an electronic component is mounted.

A configuration such as the following is conceivable as a variation of the above-described circuit structure 1. In the variation shown in FIG. 5 and FIG. 6, the gate terminal 34 (second terminal) and the conductive pattern 101 provided on the substrate 10 are connected to each other via the relay member 40 (without using the above-described step difference absorbing member 50). Different from the above-described embodiment, the relay member 40 is not entirely fixed to the conductive member 20 (second portion 22), and only a portion on the one side to which the gate terminal 34 is connected is fixed to the conductive member 20 via the insulating material 41. The portion of the relay member 40 not fixed to the conductive member 20 is deformable, and therefore, using this portion, the other side of the relay member 40 is pulled up to the one face 10a of the substrate 10. Note that it is preferable that, in order to prevent the relay member 40 and the conductive member 20 from short circuiting, the lower face of a portion of the relay member 40, excluding the portion thereof fixed to the conductive member 20, is also covered by the insulating material 41.

By employing such a configuration, there is no longer any need to use a member, such as the above-described step difference absorbing member 50, for absorbing the step difference between the upper face of the substrate 10 (one face 10a) and the upper face of the conductive member 20 (face on substrate 10 side). In other words, the relay member 40, which can be easily deformed, can be used as a member itself for absorbing the step difference.

Embodiments of the present invention have thus been described in detail, but the present invention is not to be limited to the above embodiments, and various modifications can be made provided they are in within the spirit of the present invention.

Also, in the above-described embodiment, a transistor was described as an example of the electronic component 30, but the electronic component 30 is not limited to a transistor, provided that at least one of the plurality of terminals is electrically connected to the conductive member 20 and at least another of the terminals is electrically connected to the conductive pattern 101 provided on the substrate 10.

The invention claimed is:

1. A circuit structure comprising:
a substrate provided with a conductive pattern on one face thereof;
a conductive member fixed to the other face of the substrate;
an electronic component having a housing and a plurality of terminals attached to the housing, wherein the plurality of terminals includes a first terminal and a second terminal, wherein the first terminal is electrically connected to the conductive member and the second terminal is disposed on an underside of the housing; and
a relay member for electrically connecting the second terminal to the conductive pattern provided on the substrate, the relay member having a first end mounted to the second terminal and a second end electrically connected to the conductive pattern an insulating material has a first surface attached to the first end of the relay member and a second surface attached to the substrate side of the conductive member so as to insulate the second terminal from the conductive member.

2. The circuit structure according to claim 1,
wherein one side of the relay member is connected to the second terminal of the electronic component, and
the circuit structure further comprises a step difference absorbing member that joins the other side of the relay member and the conductive pattern provided on the one face of the substrate, which is located at a position higher than the relay member.

3. The circuit structure according to claim 2, wherein a portion of the substrate is located between one side of the relay member to which a certain portion is connected and the other side of the relay member to which another portion is connected.

4. The circuit structure according to claim 2, wherein an opening is formed in the substrate, and the electronic component is mounted on the conductive member via the opening.

5. The circuit structure according to claim 1,
wherein one side of the relay member is connected to the second terminal of the electronic component, and the other side is connected to the conductive pattern provided on the one face of the substrate, and
a portion of the one side of the relay member is fixed to the conductive member.

6. The circuit structure according to claim 5, wherein a portion of the substrate is located between one side of the relay member to which a certain portion is connected and the other side of the relay member to which another portion is connected.

7. The circuit structure according to claim 5, wherein an opening is formed in the substrate, and the electronic component is mounted on the conductive member via the opening.

8. The circuit structure according to claim 1,
wherein a portion of the substrate is located between one side of the relay member to which a certain portion is connected and the other side of the relay member to which another portion is connected.

9. The circuit structure according to claim 8, wherein an opening is formed in the substrate, and the electronic component is mounted on the conductive member via the opening.

10. The circuit structure according to claim 1, wherein an opening is formed in the substrate, and the electronic component is mounted on the conductive member via the opening.

* * * * *